Nov. 28, 1972 P. J. LIMBOUGH 3,704,163

METHOD OF MANUFACTURING MINIATURIZED ELECTRIC CIRCUITS

Original Filed June 20, 1967 4 Sheets-Sheet 1

Nov. 28, 1972 P. J. LIMBOUGH 3,704,163
METHOD OF MANUFACTURING MINIATURIZED ELECTRIC CIRCUITS
Original Filed June 20, 1967 4 Sheets-Sheet 2
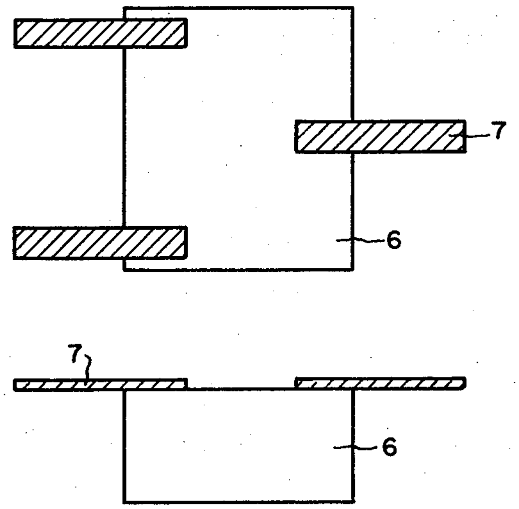
FIG. 3
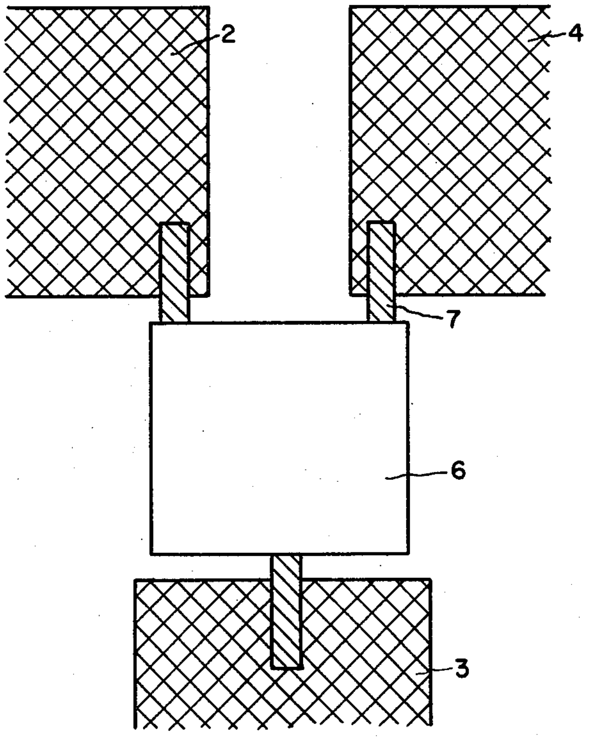
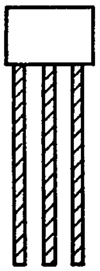
FIG. 5 FIG. 4

United States Patent Office 3,704,163

Patented Nov. 28, 1972

3,704,163

METHOD OF MANUFACTURING MINIATURIZED ELECTRIC CIRCUITS

Pol Jean Limbough, Lillois-Witterzeel, Belgium, assignor to U.S. Philips Corporation, New York, N.Y.

Original application June 20, 1967, Ser. No. 647,466. Divided and this application June 11, 1970, Ser. No. 57,876

Claims priority, application Netherlands, June 23, 1966, 6608701

Int. Cl. B44d *1/18*

U.S. Cl. 117—212 2 Claims

ABSTRACT OF THE DISCLOSURE

A method of mass producing miniaturized electrical circuits provided with supply conductors. A plate carrier is coated with a layer of electrically resistant material and then a first conductive layer is deposited on the coated plate carrier to form an electrode pattern; a second conductive layer is deposited over the carrier and electrode pattern and etched to form a supply conductor pattern, subsequently the conductor pattern is reinforced electrolytically and then the carrier is separated from these portions of second layer thus forming the supply conductors.

CROSS REFERENCE

This is a division of applicant's co-pending application Ser. No. 647,466, filed June 20, 1967, now Pat. No. 3,575,822.

The invention relates to a method of manufacturing miniaturized electric circuits, more particularly electronic circuits including miniaturized semiconductor elements. This method is in principle suitable for mass production methods, although it can be used advantageously with any manufacture. The term "semiconductor element" is to be understood to mean a semiconductor body with one or more circuit elements some parts of which may be connected to each other by a conductor formed on the body, and further include therein active circuit elements which are formed by a number of adjacent regions of opposite conductivity which have been diffused into the semiconductor body. In general a miniaturized circuit includes a number of passive elements (resistors, capacitors, etc.) which are formed on a carrier, for example, by vapor deposition, and in turn these elements are connected together in a conductive electrode pattern which is also applied to the carrier, for example, by vapor deposition. If the circuit also includes semiconductor elements these are fixed to the carrier thereafter (for example by adhesion) and the electrodes of each element are electrically connected to the electrode pattern in the desired manner. Each circuit is manufactured on a carrier which is as small as possible, and is preferably covered with a layer of synthetic material, for example, epoxy resin, in order to protect the circuit from external damage.

This circuit must, however, be provided with supply conductors before being covered with the layer of synthetic material and these conductors must project from this layer. In fact, the supply voltages, i.e. the input and output signals must be supplied to or recevied from the circuit via these conductors. If this circuit applied to the carrier, covered with the layer of synthetic material and having projecting supply conductors should serve as a final commercial product then these supply conductors should be rigid and easy to handle so that the user can solder the product into its final product by conventional means and methods also in the manufacture of semiconductor elements such as transistors which used in a final commercial product, the same problems occur. Since it is advantageous to start from a miniaturized semiconductor element and since these are manufactured, for example, by diffusion of several elements into the same semiconductor plate by the known planar techniques, it should be apparent that the smaller they are in size, the more that can be obtained from one plate in the same manufacturing process. These elements are, however, manufactured to small dimensions $100\mu$ x $100\mu$ x $100\mu$) and correspondingly the conductive surfaces thereon which are the electrodes of the element, also have small dimensions $60\mu$ x $60\mu$. Thus, it is almost impossible to solder to the electrode's supply wires. These electrode elements could have a larger size, however such would be disadvantageous. A solution to this problem has been found by fixing the small semiconductor element to a carrier (for example by adhesion) on which an identical number of larger electrodes have previously been applied (for example by vapour deposition) and to which the rigid supply wires can easily be soldered. By means of very thin gold wires (diameter for example $15\mu$) these larger electrodes can then electrically be connected to the small electrodes of the element. Thereafter the rigid supply wires are soldered to the electrodes of the carrier, and the whole is covered with a protective layer. Such a carrier therefore includes a vapour deposited elementary circuit, namely the conductive electrode pattern on the carrier between the position where a supply conductor has been soldered and the position where the corresponding gold wire has been connected.

Similar miniaturized circuits on a carrier which are covered with a resin layer and provided with projecting soldered supply wires are shown in the British patent specification No. 1,015,532.

It is, however, desirable for these products to be manufactured in series or mass produced, so as to be suitable for automation. To obtain a series production, attempts have been made to carry out the successive operations which each carrier must undergo in common with many other carriers. Roughly speaking, these operations are: forming, for example, by vapor deposition of the circuit, fixation of the, electrical connection of the, soldering of the supply wires and covering with a synthetic material. The simultaneous vapour deposition of a plurality of circuits on a corresponding carrier is not difficult. The circuits are applied to a common carrier whereafter the common carrier can be divided into pieces, each piece being the carrier of such a circuit. However, if this division is effected prior to the next operation, that is before the semiconductors are fixed to each carrier and are connected to each circuit then the latter operation is very difficult: the carriers must be placed in their correct position under the working mechanisms or machines and are difficult to handle owing to their relatively small dimensions. It is therefore advantageous to fix the semiconductor elements to the corresponding carrier and to connect them to the corresponding circuits while the latter are still on the common carrier. In this way, the next circuit can be placed under the working mechanism or machine by a simple recilinear movement of the common carrier. As a result the operation is suitable for automation. This operation can also be carried out so that all semiconductor elements which must be connected to the circuits on the common carrier undergo this operation simultaneously and in common. This is, for example, the case with the so-called "face-bonding method with solder balls" such as are described in the article by G. Sideris "Bumps and Balls, Pillars and Beams, a Survey of Face-bonding Methods," in Electronics of June 28, 1965, page 68. For this operation other methods can also be used, more particularly the methods mentioned in the article referred to.

The next operation is the soldering of supply wires. For easy handling of the carrier it is desirable to do so before the common carrier is divided into pieces. Soldering of the wires to a common carrier will not cause difficulties if the circuit is designed sufficiently large so that each soldering point can easily be reached. Here, however, a common processing is out of the question and furthermore each circuit must in this case be designed so large that only few circuits can be applied to each common carrier so that only few carriers can undergo the successive operations in common. Therefore it is more advantageous at this stage to divide the common carrier into the small separate carriers and then the supply wires can be soldered more easily to each separate carrier. In addition, each carrier must separately be covered with a protective layer of synthetic material. The latter two operations are therefore not carried out in common and are also difficult to automatize owing to the difficulty in placing the carriers in the correct position. This difficulty does not render the manufacturing method very interesting. The application of the supply wires to the small carriers on a common carrier and their electrical connection to the circuit would thus have to be effected in common and with very fine means in order to reduce the dimensions of each circuit.

An object of the invention is to provide a method of applying these supply conductors to a plurality of small carriers which form part of a common carrier, and to connect the conductors to the circuit on the carrier in a common operation. Covering with a synthetic material can therefore also be effected in common, so that the carriers must be separated only at the end of the manufacturing process.

According to the invention the supply conductors are obtained by providing a larger carrier, which is further called a primary carrier, with a layer of conductive material in the form of the supply conductors, the latter adhering over a part of their length more strongly to the primary carrier than over a part contiguous thereto, whereafter the part of the primary carrier to which the less adhering part of the supply conductors has been applied is removed so that these less adhering parts disengage from the carrier as projecting supply conductors. The supply conductor layer is formed on the primary carrier in at least two stages, the part of the primary carrier intended for strong adhesion is first covered with a first layer which adheres to the carrier, and which in turn is covered with the conductor layer which does not adhere as well to the carrier than to the first layer. In this way it is possible to form the supply conductors in common. The supply conductor is thus formed by the second layer, and the first layer does not necessarily have to be conductive.

According to a further characteristic of the invention the supply conductors are electrically connected in common in that the first layer is manufactured of conductive material and extends over a larger area than the second layer, thus forming the desired electrode pattern for connection to each circuit element. This means that the second layer is applied on top of the first layer at the area of connection of the supply conductors to this pattern and that the electrical connection to the circuit is thus automatically obtained.

If the second layer cannot be made thick enough because it was, for example, vapour deposited, then, according to a further characteristic of the invention, this layer can be reinforced at least under the part of the supply conductor under which the carrier is removed and preferably also over a further part adhering to the carrier under which the rest of the part adhered to the carrier which is intended for connection to the circuit elements is thinner than the first-mentioned reinforced part. These thin parts of the supply conductor can then approach each other very closely and in certain cases this is necessary.

According to a further characteristic of the invention, the second layer is reinforced by a thick layer of conductive material which was preferably applied on top of the second layer by electrolysis. In this manner the reinforcement is easily achieved although it is not necessary for the reinforced layer to be conductive. Of course the semiconductor elements may be fixed and electrically connected only after these operations.

Since this carrier is not only provided with the circuit but also with the supply conductors, this common carrier must now be divided into carriers, on which the circuit and the associated supply wires are present. These carriers are therefore larger than the carriers which it is desired to manufacture and comprise the circuit only. Such a primary carrier will thus be broken into two parts: the first part, hereinafter called the part to be retained to which the circuit is applied and on which a short end of each of the applied wires is also present, and a second part, hereinafter called the part to be removed which includes the rest of the wires. The first part forms the carrier to be actually manufactured and the second part does not belong to the final product and is removed from this first part and the supply wires. Upon breaking care should be taken that the wires remain adhered to the part to be retained and that they can be separated from the part to be removed without breakage. In the embodiment according to the invention this is easily achieved because the wires on the part to be retained are strongly adhered due to the first layer and are adhered much less to the part to be removed to which they have been applied without an intermediate layer.

It is to be noted that the step consisting in electro lytically depositing input terminals, and afterwards breaking a part off the carrier to which they were deposited, is known from British patent specification No. 775,267. Here, however, no use was made of a first layer which is well adhered to the carrier and along which a short end of the supply conductors are rigidly adhered via this layer to the part of the primary carrier which is to be retained, so that the supply conductors can be made of material which adheres much less rigidly to the part to be retained. The application of this step in manufacturing a carrier according to the invention affords however, the further special advantage that, besides the advantage of a common fixation of the supply conductors to the carrier, the electrical connection is effected in the same operation and thus also in common because care is taken that the said short end of each wire which is situated on the carrier is applied on top of the electrode pattern which serves for the mutual connection of the supply conductors and the circuit elements on the carrier. As a result a soldering operation is no longer necessary for connecting the supply conductors to the circuit elements to be connected. Due to the possibility of this common operation this application affords a further special advantage in that the following operations can also be carried out in common. In general care must be taken that the combination of the materials for carrier, first layer (of which the electrode pattern possibly consists) and supply conductor layer is such that the first layer well adheres to the carrier and the supply conductor layer and that this latter layer poorly adheres to the material of the carrier so that the superfluous parts of the primary carrier can be broken off without danger. The British patent specification referred to does not give a solution for this problem.

Since it is desirable that the supply conductors thus formed are rigid, it will be attempted to make the supply conductor layer as thick as possible. Electrolysis is particularly suitable for this purpose, but it can of course not be applied to a non-conductive carrier. For this reason a thin supply conductor layer should always be applied beforehand. Subsequently the supply conductor pattern can be reinforced by electrolysis. The thin supply conductor layer can, however, also be reinforced by a non-conductive layer because the thin conductor layer is sufficient to carry the current. The principal matter is that this reinforcing layer well adheres to the supply conductor layer. The principle of some methods and embodiments will further be explained with the aid of an example: the manufacture of a commercial transistor element which has rigid input wires to the collector, base and emitter of the microtransistor which is the starting point, this microtransistor being fixed to a carrier which is covered with epoxy resin. In this explanation reference will be made to the following figures:

FIG. 3 shows a microtransistor which can advantageously be used in an embodiment;

FIG. 4 shows this transistor after fixation to the plate;

FIG. 5 shows the final product according to the example;

Figure 7A:
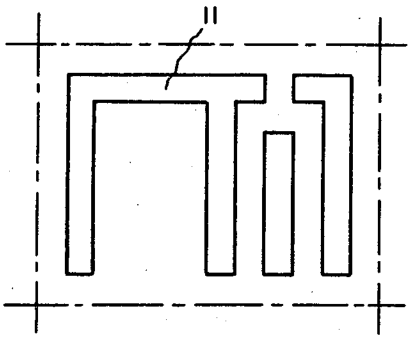
Figure 7B:
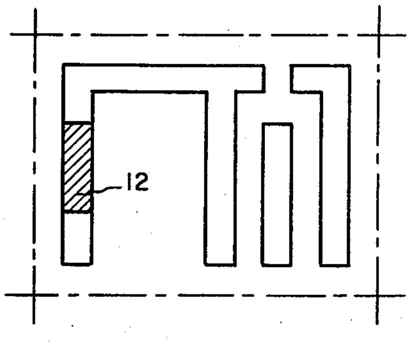

FIGS. 7*a* and 7*b* show two intermediate stages in another example of application.

A first conductive layer of material rigidly remaining adhered to the plate is vapour deposited. On one side of the non-conductive glass or ceramic plate (4 cm. x 1½ cm.) and through a metal mask. For this purpose a glass can be taken which is specially used for vapour depositing thin films such as, for example, glasses on the basis of borosilicate glass. Enamelled ceramic can also be used. The electrode pattern will be etched from this layer. Only that part of the plate on which these patterns will be etched will receive this layer, and hence that part from which the parts to be retained of each element to be manufactured will be broken. This is represented by area 1 in FIG. 1. The metal mask thus serves only to apply the layer to this area. This rigidly adhering layer may be an aluminium-chromium layer which is an aluminium layer (1 to 2$\mu$ thick) with a very thin chromium layer on top of it (200 A.).

Figure 1:
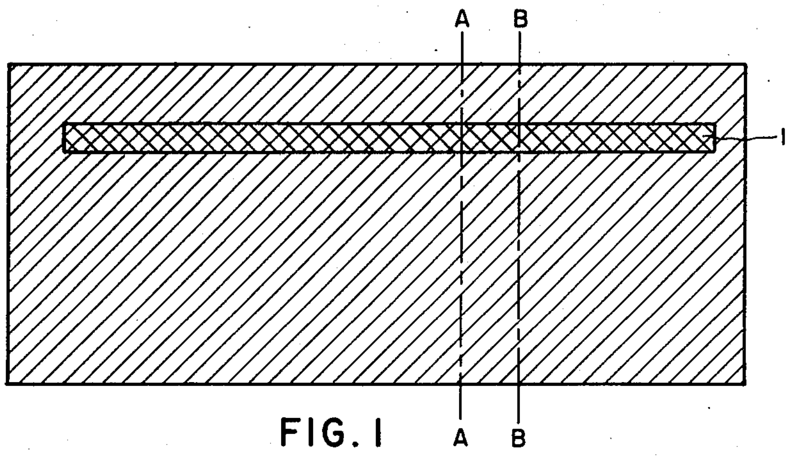
FIG. 1 shows the common carrier after vapour deposition of two conductive layers.

Subsequently a second layer is vapour deposited on the entire area of this plate, a common carrier. According to the invention, this layer must be conductive, rigidly adhering to the first vapour deposited layer (for example, the aluminium chromium layer) and slightly adhering to the glass plate. For a first aluminium chromium layer, a vapour deposited copper layer of, for example, 1$\mu$ is sufficient. FIG. 1 shows the common carrier with both vapour deposited layers (aluminium chromium layer and vapour deposited copper layer). The figure shows cross-hatching where two layers are present. It is to be noted that the very thin chromium layer is only present to prevent formation of a copper aluminium alloy, because this alloy adheres less rigidly to the glass.

In a following operation this plate is provided with an etching mask by means of a known photo-etching method. To this end the plate is covered with a photo-sensitive lacquer. A photographic film is laid on this lacquer and the whole is exposed. Dependent on the lacquer used, the exposed or unexposed part will disappear in a chemical solvent so that the etching mask only remains on the plate. The Kalle lacquer which is sold commercially can be used as a lacquer, and a 1½% KOH solution as a solvent.

Figure 2:
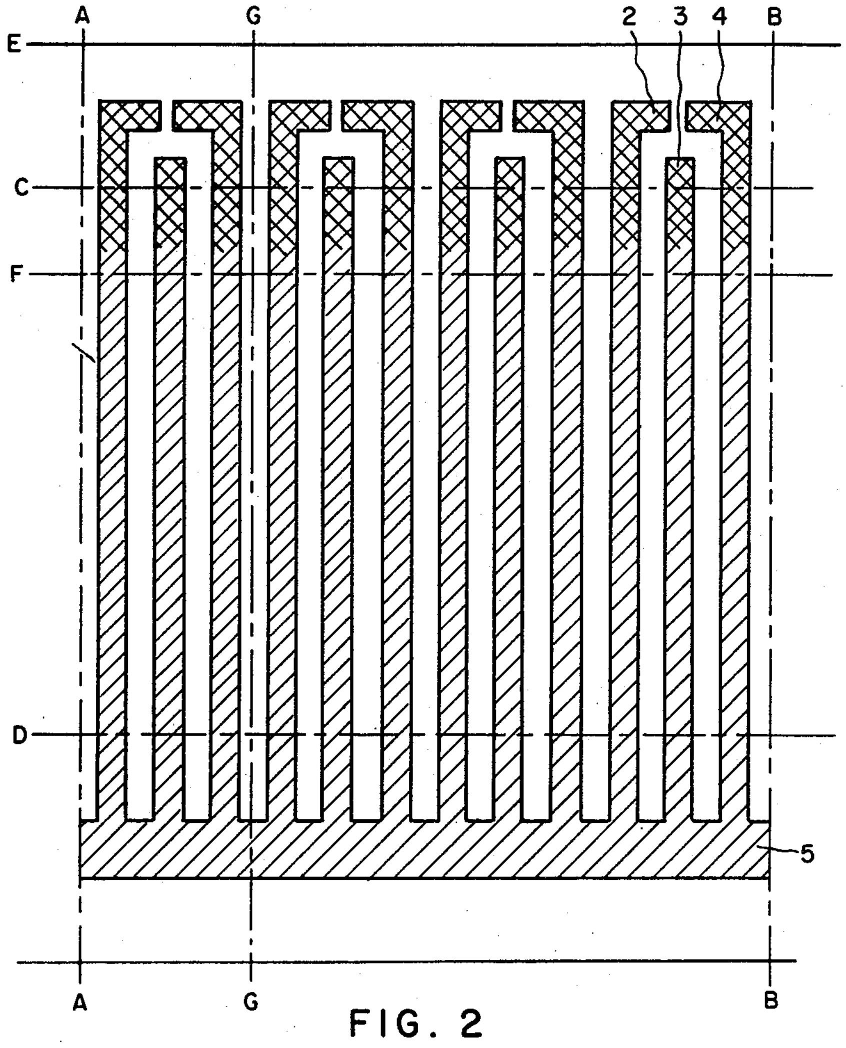
FIG. 2 shows a part of this plate after etching.

Subsequently the poorly adhering second layer is removed at those areas which are not covered by the mask by immersing the plate in an etching bath. For example, in this manner a copper layer is etched away in a $HNO_3$ solution. Then the first conductive layer is also etched away via the same mask. Thus an aluminium chromium layer is etched away in a $H_3PO_4$ solution. The two layers can be advantageously etched away in the same etching bath consisting of an $FeCl_3$ solution. The result of this etching treatment is shown in FIG. 2. This figure shows a part of the plate comprising four electrode patterns. In this case this electrode pattern serves for connection of the three supply conductors to a microtransistor. Each vapor deposited electrode pattern is formed on those areas where the figure shows the points of connection

2, 3 and 4. At these areas the poorly adhering second layer, in this case the copper layer, is also present as well as at the areas (the hatched parts between the chain lines C and D) where the supply conductors will be thickened electrolytically and lastly at the areas (the hatched parts under the chain line D) along which the electrolysis current will have to be removed.

In a following operation the wires are now electrolytically reinforced. To this end a mask covers all areas where the material must not be applied. An ordinary adhesive tape, for example of the type "Sellotape" is sufficient for this and thus only the area on the plate between the chain lines C and D (FIG. 2) is left uncovered. Another electrode is soldered to the connecting conductor 5 and the whole forms an electrode for the electrolysis and is immersed in the electrolytic bath. In this case this is a $CuSO_4$ solution, so that copper will be deposited on the poorly adhering copper layer. This electrolytic layer is then intimately connected to the poorly adhering copper layer. After the supply conductors are thickened sufficiently this electrode is removed from the solution and the electrode of the plate and the mask, in this case the adhesive tape, are removed. The part of the plate, under the chain line D, which was only necessary to serve as a carrier for the drain paths of the electrolysis current is now also removed. In this case this can be done by scratching and breaking the plate alongside the line D. This part could, however, also be removed in another manner, for example, by etching or grinding.

Now the electrode pattern and the supply conductors are applied to each primary carrier, each supply conductor being connected to the electrode pattern. All this has been effected on the plate, the common carrier. In a following operation the micro-transistors can be soldered to each circuit. FIG. 3 shows such a microtransistor 6 with the three small electrodes 7, the base, emitter and collector. This is a so-called Beam-Lead transistor which is known from the same article by G. Sideris referred to. Each transistor is soldered to its corresponding elementary circuit as is shown in FIG. 4. Here the points of connection 2, 3 and 4 of the transistor are indicated by the same reference numerals as in FIG. 2. These microtransistors are extremely small. As already mentioned their size is, for example 100$\mu$ x 100$\mu$ x 100$\mu$. For this reason the adjacent conductors 2, 3 and 4 must approach one another up to distances of 50$\mu$. Since this circuit has been vapor deposited this is possible. Such small distances could never be achieved electrolytically since the layer itself is 100$\mu$ to 200$\mu$ thick and the three conductors would thus grow into each other. The vapour deposited aluminium-chromium layer is therefore certainly necessary because the electrolytically laid wires can never approach the points of connection with a transistor so closely as up to 50$\mu$. It is evident that any other microtransistor can be used with a different fixation method (for example with the solder balls as mentioned in the article referred to).

Now the plate can be scratched at the height of the chain line F in FIG. 2, and immersed in a protective epoxy resin up to this line, so that all transistors and their points of connection with the carrier are covered. After hardening, the plate is divided, for example, by breaking or sawing into pieces, which are the primary carriers each including a transistor and the associated input wires such as, for example, the piece bordered by the lines A, C, E and D. Each primary carrier has two parts: the first part, the part to be retained, and situated above the line F, includes the vapour deposited circuit 2, 3, 4 and also a short end of the applied wires. The other part, under the line F, carries the rest of the wires and this part of the carrier has become superfluous. This primary carrier is thus broken along the line F along which scratches had previously been made, and the wires are peeled off this part to be removed. This is done without a risk of breakage of these wires, for they engage the copper layer which is not rigidly adhered to the glass.

On the portion under line C, these wires are, however, rigidly fixed to the part to be retained, and this is therefore the actual carrier bordered by the lines A, C, E and F, thus representing the final product (FIG. 5). Breaking can also be effected first along the line F and then along the vertical line A, C, etc.

As already mentioned the advantage of this method resides in the fact that the input wires can be provided and electrically connected in common and at the same time and that the common plate need not be divided into pieces for this purpose. It will, however, be evident that on the common plate an area for each transistor must be used, which is much larger than that of the carrier to be manufactured, since the primary carrier must also include the part to be removed to which the wires are applied. As a result fewer circuits can be vapour deposited on one common carrier. This could be corrected by making the wires as short as possible, without impeding the easy handling of the product. A good method of mitigating this drawback consists in applying the wires in the manner shown in FIG. 6. The part to be retained of each carrier is represented by a square between the chain lines. The wires for carrier 8 were applied, as shown and the area where the vapour deposited circuit is not covered with the electrolytically deposited layer is hatched. This arrangement has three advantages. A first advantage is that the common plate no longer includes parts to be removed. The part which would be called the part to be removed for the one primary carrier now forms the part to be retained for the two adjacent primary carriers. The primary carrier associated with the manufacture of carrier 8, now consists of the surface area occupied by the squares 8, 9 and 10. Here the part to be retained is square 8. However, the square 9 to be removed is, for example, the part to be retained of the carrier 9. As a result of this step the ratio between the effective area and the ineffective area on the common carrier can be made larger and therefore more circuits can be applied thereto. A second advantage is that when breaking the carrier, for example, along the line AA, the part 8 to be retained is separated from the part 9 to be removed in each primary carrier (for example 8, 9, 10), and that simultaneously the carrier 8 to be manufactured is separated from the carrier 9 to be manufactured. In the set-up of FIG. 2 the parts to be retained first had to be separated from the parts to be removed, the parts to be retained remaining adhered together and subsequently these parts to be retained had to be separated from one another. If in the set-up of FIG. 6 the parts to be retained are separated from the parts to be removed, then all parts to be retained are also separated from one another simultaneously. A third advantage is the fact that the projecting wires of each carrier are farther remote from one another than in the set-up of FIG. 2. They are therefore also easier to handle. Other set-ups can of course also be used to obtain similar advantages. To this end care must only be taken that the superfluous parts of one primary carrier form part of the portion to be retained of one or more adjacent carriers, it being possible to break the common carrier via lines long which the part to be removed is broken off the part to be retained of various primary carriers and along which simultaneously the part to be retained of primary carriers is separated from the part to be retained of the adjacent primary carriers. Here the primary carrier of a carrier to be manufactured is to be understood to mean the part of the area of the common carrier to which the electrode pattern and the supply conductors for this carrier to be manufactured have been applied. For this carrier the part to be retained is the part of the primary carrier form which the carrier actually to be manufactured is broken off.

Figure 6:
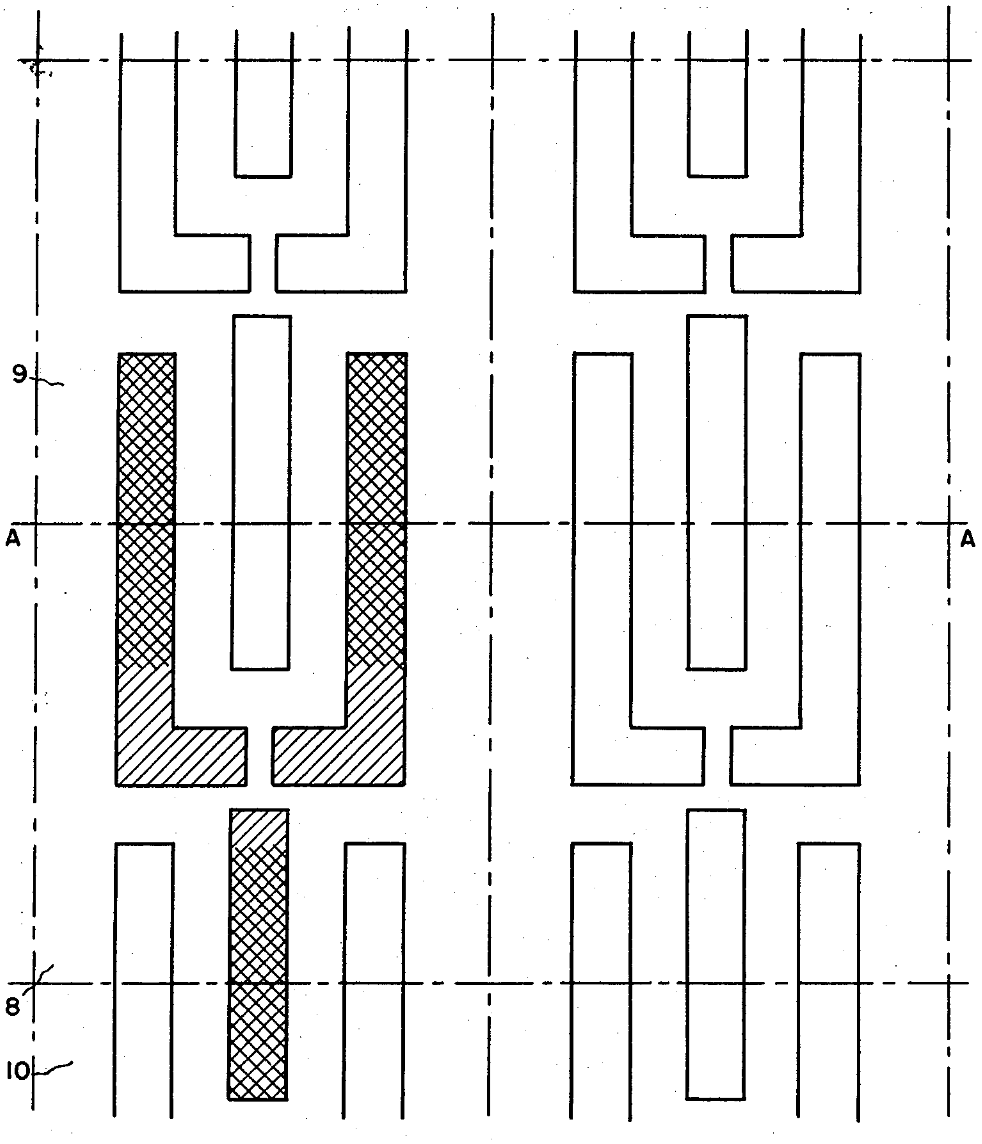
FIG. 6 shows another arrangement of the wires applied.

In the electrolytic reinforcement of the supply conductors according to an arrangement other than that of FIG. 2 the difficulty presents itself that the drain paths for the electrolysis current which must be removed afterwards will be situated in an intricate pattern and the removal thereof will therefore be difficult. In the arrangement of FIG. 2 these drain paths were situated under the line D, and had a comb-shaped connection with the common connection conductor 5. This comb could simply be removed by breaking along the line 5. In the arrangement of FIG. 6 simple breakage is not possible but one will get around this difficulty by applying the invention idea to a manner other than that in the first example. Firstly the electrode pattern consisting of the aluminium chromium layer will be vapour deposited, using a metallic mask. Then the thin copper layer is vapour deposited throughout the surface. A mask will now be applied to this surface, for example, by the mentioned photo etching methods. An electrode for the electrolysis will then be fixed to the thin copper layer and the whole will be immersed in an electrolytic bath. Only at the area where the supply conductors must be reinforced will the thin copper layer contact the electrolytic solution, for example, $CuSO_4$. The entire vapour deposited copper layer under the mask now serves as a drain path for the electrolysis current. After the supply conductors are sufficiently thickened the plate is removed from the bath and then the electrode is removed as well as the mask.

In a following operation the plate is immersed in an etching bath consisting of a substance which attacks the copper layer but not the circuit (for example $HNO_3$). The vapour deposited copper layer is removed throughout those areas where it is not covered by the thick electrolytic layer. An equally thin layer is of course also removed from the thick electrolytic layer but this is not noticeable. The common carrier shown in FIG. 6 is then ready without difficulty being involved in removing the drain paths. This is because the drain paths are in fact etched away in a bath which does not attack the material of the electrode pattern. It will be evident that the input wires can also be formed by applying the thick electrolytic layer to the entire area and afterwards etch away the superfluous parts through a mask. In this case this thick layer can possibly be applied in a manner other than electrolysis, namely by fixing a copper sheet to this area in as far as this sheet well adheres to the circuits and poorly adheres to the carrier. Reference will now be made to another embodiment using other materials. Firstly a thin layer (100 A.) of nickel chromium alloy is vapour deposited on the common carrier over the entire area. This material, better known under the name of "Nichrome" is known as a resistant material and well adheres to the carrier of borosilicate glass. Subsequently a nickel layer (2 to 3$\mu$) is vapor deposited on the entire area. This layer remains rigidly adhered to the Nichrome layer. A mask is applied to these layers in known manner and the whole is immersed in an $HNO_3$ solution and then in a solution of $CuSO_4$, so that the uncovered parts of the nickel and Nichrome layers are removed. The result is shown in FIG. 7*a*. Here the figure shows the part to be retained of a primary carrier to which the circuit must be applied and to which bands 11 well adhering to the carrier have been vapor deposited, the bands consisting of a nickel layer with the Nichrome layer underneath. Subsequently, a new mask is applied to this carrier in known manner and certain parts of the nickel layer are removed from bands 11 by immersion in an $HNO_3$ solution. The result after removal of the mask is shown in FIG. 7*b*. The primary carrier includes in this case a Nichrome resistor 12, and the rest of the bands adhering to the carrier form the electrode pattern which serves for the mutual connection of the circuit elements on the carrier. The electrode pattern is therefore the pattern of the conductors along which the mutual connection of the circuit elements is obtained. Subsequently a thin copper layer is vapour deposited on the entire area to which a mask is applied in known manner according to the pattern of the parts to be reinforced of the supply conductors. The supply conductors are then further formed and finished as indicated in the paragraph on the application of the supply conductors shown in FIG. 6.

The invention is by no means limited to the embodiments shown or materials mentioned here for the sake of clarity. All materials the combination of which satisfy the conditions already mentioned can be used. Also any etching or electrolytic bath mentioned can be replaced by another which yields similar results. If necessary the well adhering and the poorly adhering layer can be applied in a manner other than vapour deposition insofar as the required accuracy can be achieved therewith.

In the examples given here it was shown how a carrier was manufactured with a very elementary electrode pattern, namely the three connecting conductors of the ends of each supply wire to the points of connection with the microtransistor. In a wider sense of the word this is considered here to be a circuit. The carrier may, however, include an intricate circuit to which a plurality of semiconductor elements have been fixed and to which passive elements such as resistors and capacitors have been applied. This carrier may have any shape whatever. In case this carrier is foldable it can, for example, also be rolled up.

What is claimed is:

1. A method of manufacturing a carrier for a miniaturized electric circuit containing one or more miniaturized circuit elements, comprising the steps of depositing a strongly adherent electrically resistive layer over the entire area of an uncoated carrier; depositing a first layer of strongly adherent electrically conductive material over the entire resistive layer; masking selective areas of the double layered carrier; etching the unmasked portions of said layer carrier and removing the unmasked resistive and first conductive layers so as to form a pattern of bands in the combination of layers; removing parts of said first conductive layer thus exposing portions of the resistive layer; depositing a second electrically conductive layer over the entire area of said carrier, said second conductive layer adhering better to said first conductive layer then to the uncoated carrier; shaping said second conductive layer as supply conductors; and removing at least a portion of the carrier not covered by said first layer so that said shaped supply conductors will project from the remaining portion of the carrier.

2. The method according to claim 1 wherein said resistive layer is formed of a nickel-chromium alloy, said first layer of conductive material is nickel, said second layer of conductive material is copper and wherein said uncoated carrier is glass.

References Cited

UNITED STATES PATENTS

| | | | |
|---|---|---|---|
| 3,310,432 | 3/1967 | Griest et al. | 204—15 |
| 3,348,299 | 10/1967 | Knutson | 117—213 X |
| 3,381,256 | 4/1968 | Schuller et al. | 117—217 X |
| 3,408,271 | 10/1968 | Reissmueller et al. | 204—15 |
| 3,537,175 | 11/1970 | St. Clair et al. | 117—212 X |

RALPH S. KENDALL, Primary Examiner

D. A. SIMMONS, Assistant Examiner

U.S. Cl. X.R.

29—625; 117—8, 217

PO-1050
(5/69)

UNITED STATES PATENT OFFICE
CERTIFICATE OF CORRECTION

Patent No. 3,704,163 Dated Nov. 28, 1972

Inventor(s) POL JEAN LIMBOUGH

It is certified that error appears in the above-identified patent and that said Letters Patent are hereby corrected as shown below:

Column 7, line 3, "A, C, E and F" should read --A, G, E and F-- line 6, "A, C" should be --A, G--

Signed and sealed this 22nd day of May 1973.

(SEAL)
Attest:

EDWARD M.FLETCHER,JR.
Attesting Officer

ROBERT GOTTSCHALK
Commissioner of Patents